United States Patent [19]
Rossi

[11] Patent Number: 5,663,721
[45] Date of Patent: Sep. 2, 1997

[54] METHOD AND APPARATUS USING CODE VALUES AND LENGTH FIELDS FOR COMPRESSING COMPUTER DATA

[75] Inventor: Markku J. Rossi, Houston, Tex.

[73] Assignee: Compaq Computer Corporation, Houston, Tex.

[21] Appl. No.: 407,195

[22] Filed: Mar. 20, 1995

[51] Int. Cl.⁶ .................................................. H03M 7/42
[52] U.S. Cl. ......................... 341/51; 341/67; 341/95; 341/106; 341/107
[58] Field of Search ........................... 341/51, 65, 67, 341/95, 106, 107

[56] References Cited

U.S. PATENT DOCUMENTS

| | | | |
|---|---|---|---|
| 4,396,906 | 8/1983 | Weaver | 340/347 |
| 4,862,167 | 8/1989 | Copeland, III | 341/107 |
| 4,876,541 | 10/1989 | Storer | 341/51 |
| 4,899,148 | 2/1990 | Sato et al. | 341/65 |
| 5,034,742 | 7/1991 | Bond et al. | 341/67 |

OTHER PUBLICATIONS

J. Ziv & A. Lempel, "A Universal Algorithm for Sequential Data Compression," *IEEE Transactions on Information Theory*, vol. 23, No. 3, May 1977, pp. 337–343.

J. Ziv. & A. Lempel, "Compression of Individual Sequences via Variable–Rate Coding," *IEEE Transactions on Information Theory*, vol. 24, No. 5, Sep. 1978, pp. 530–536.

Donald E. Knuth, "Sorting and Searching," *The Art of Computer Programming*, vol. 3, pp. 506–542, 1973.

Terry A. Welch, "A Technique for High–Performance Data Compression," *Computer*, pp. 8–19.

Ross N. Williams, "An Extremely Fast ZIV–Lempel Data Compression Algorithm," *Data Compression Conference*, 1991, pp. 362–371.

Recommendation V.42 bis, "Data Compression Procedures for Data Circuit Terminating Equipment (DCE) Using Error Correcting Procedures," The International Telegraph and Telephone Consultative Committee, 1990, pp. 1–27.

*Primary Examiner*—Brian K. Young
*Assistant Examiner*—Jason H. Vick
*Attorney, Agent, or Firm*—Pravel, Hewitt, Kimball & Krieger

[57] ABSTRACT

A data compression algorithm in which a word is assigned a code value according to the frequency of the word occurring, for example, in the English language. The code value contains a length field and a code field. The number of bits used to represent the length field is fixed, whereas the length of the code field is variable. The code field can be assigned values between 0b0 and 0b111111111111111. The value 0b0 is assigned for the word having the greatest probability of occurring and the value 0b111111111111111 is assigned for the word having the least probability of occurring. The value of the length field is equal to the number of bits contained in the code field. The code values are stored in a dictionary with their corresponding words. If it is determined that an input word does not exist in the dictionary, then the length field is assigned the value 0b0000 and the word is represented in its ASCII code. Examples of dictionaries that can be used with the compression algorithm are the English dictionary, Spanish dictionary, German dictionary, a dictionary for engineering applications, a dictionary for lawyers, and a dictionary for bioscientists.

13 Claims, 8 Drawing Sheets

| PORTIONS OF THE DICTIONARY | | |
|---|---|---|
| FIRST SECTION | | |
| THE | 0001 | 0 |
| AND | 0001 | 1 |
| ING | 0010 | 00 |
| FOR | 0010 | 01 |
| THIS | 0010 | 10 |
| THAT | 0010 | 11 |
| BUT | 0011 | 000 |
| ⋮ | | |
| FATHER | 0101 | 10111 |
| ⋮ | | |
| XYLOPHONE | 1110 | 11111111111111 |

METHOD AND APPARATUS USING CODE VALUES AND LENGTH FIELDS FOR COMPRESSING COMPUTER DATA

BACKGROUND OF THE INVENTION

1. Field of the Invention

The invention relates to a technique of compressing data for transmission over a communications network, and more particularly, to a compression method based on the statistical probability of a word or character occurring.

2. Description of the Related Art

Various compression algorithms have been utilized to reduce the amount of data that to be transmitted between two devices connected by a transmission line or a communications network. Compression algorithms such as the PKZIP, PKUNZIP and PKARC which use the .ZIP and .ARC file formats are widely available on on-line services, such as Compuserve, and other electronic bulletin boards. Another type of algorithms that is widely used is the Lempel-Ziv data compression algorithm. The Lempel-Ziv algorithm is well known in the art and a good overview is provided in Ross N. Williams, *An Extremely Fast ZIV-Lempel Data Compression Algorithm*, DCC '91 Data Compression Conference pp. 362–371 (1991), which is hereby incorporated by reference. The Lempel-Ziv algorithm dynamically converts strings of input symbols or characters into fixed length codes. This algorithm builds a table of strings with their corresponding codes during the compression process. The table of strings is referred to as an uncompressed destination block. Thus, each time a new string is encountered, that string is placed into the uncompressed destination block and provided with an equivalent code. As a result, the first occurrence of any string is not compressed. The uncompressed string is referred to as a literal.

The Lempel-Ziv algorithm generates control words to indicate whether a string is compressed or uncompressed. The control word consists of an offset count, a literal count, and a copy count. The literal count specifies the number of bytes following the control word that are literals. The number of bytes specified by the literal count are copied to the uncompressed destination block directly.

Thus, the offset count and the copy count are the fields through which actual compression is accomplished. If it is determined that the string is already in the uncompressed destination block, then the offset count and copy count are assigned non-zero values. The offset count specifies how far back into the previously written destination block, known as "the history," to look to find the string. The copy count indicates the number of bytes to copy from that offset count to retrieve the string. Thus, for example, a copy count of 3 and a offset count of 4 would cause the algorithm to look back 4 bytes into the history, and from there, copy 3 bytes to the current location when the compressed data is being decoded. Since the offset count is represented by a limited number of bits, it can access only a portion of the entire history. That portion of the history is known as the "Lempel."

To reduce the amount of time required to determine if a matching word is in the history, Lempel-Ziv algorithms typically use a hash function and hash table to generate compressed data. See Donald E. Knuth, *The Art of computer Programming*, pp. 506 et seq. (1973), which is hereby incorporated by reference. In one implementation of the Lempel-Ziv algorithm, for example, the hash function maps any 3-byte key to a single pointer located in the hash table that can point anywhere in memory, but which is likely to point to a matching key somewhere in the Lempel. The 3-byte key consists of the next 3 bytes of input data that are to be compressed. Thus, the 3-byte key accesses a single location in the hash table. The pointer address contained at that location is retrieved, and the data pointed to is then compared with the data to be compressed. If the data pointed to in the Lempel actually matches the data to be compressed, then a copy count and an offset count are generated to represent the compressed data.

With the Lempel-Ziv algorithm, since the first occurrence of a character or word is not compressed, the compression ratio during the initial portion of a document or text file is poor. In addition, the compression ratio also depends upon the redundancy characteristics of the document or text file. Thus, if the document or text file is not homogenous and its redundancy characteristics shift, then compression efficiency declines if the length of the document or text file significantly exceeds the length of the Lempel.

Another popular compression algorithm is the V.42bis procedure, described in detail in *Data Communication Over the Telephone Network: Data Compression Procedures for Data Circuit Terminating Equipment (DCE) Using Error Correction Procedures*, The International Telegraph and Telephone Consultative Committee (CCITT) Recommendation V.42bis, pp. 1–27 (1990), which is hereby incorporated by reference. Data is compressed according to the V.42bis algorithm by encoding a string of characters as a fixed length code word. The algorithm uses dictionaries in which the strings are stored. The dictionaries are dynamically updated during normal operation. A feature of the V.42bis algorithm is that infrequently used strings are deleted from the dictionary to conserve storage capacity.

The dictionary is represented as a set of trees as shown in FIG. 1. Each tree contains root nodes and leaf nodes, wherein a root node represents the first character in a string and a leaf node represents the last character in a string. A node that has no dependent nodes is a leaf node and a node that has no parent represents a root node. In FIG. 1, the root nodes are nodes A, B, C, and D, and the leaf nodes are nodes G, R, T, N, and G. Node B is the parent of nodes A and I, node I is the parent of N, and so forth. Each tree represents a set of known strings beginning with one specific character and each node or point in the tree represents one of the set of strings. Thus the trees shown in FIG. 1 represent the strings A, B, BA, BAG, BAR, BAT, BI, BIN, C, D, DE, DO and DOG. Each node is identified with a fixed length code word.

In the V.42bis algorithm, the dictionary generated by the device transmitting the string of characters is transmitted along with the compressed data to the receiving device so that the receiving device is able to decompress the received data. Thus, the V.42bis algorithm shares the disadvantage of the Lempel-Ziv in requiring that the first occurrence of any string must be transmitted.

The V.42bis algorithm dynamically updates the dictionary as it receives input strings. The dictionary is initialized to an initial condition, where each tree in the dictionary consists only of a root node. The code word associated with each root node is initially assigned a length of 9 bits. The maximum length of the code word is programmable by the user. The procedure for matching a sequence of characters with a dictionary entry is as follows. Initially, the first character of the sequence is used to form a string which is placed into the last entry of the dictionary. Next, the string is compared with entries in the dictionary to determine if a match occurs. If so, it is determined if the match is with the entry that was just created. If not, it is confirmed that a match has occurred, and the next character from the input sequence of characters is appended to the string. The two-character string is then compared again with entries in the dictionary to determine if a match occurs. This process is continued until the string does not match a dictionary entry or it matches the last entry that was just created in the dictionary. If either of these two conditions occurs, then a matching entry has not been found in the dictionary. In that case, the last character that was appended to the string is removed, and the resulting string of characters represents the longest matching string that exists in the dictionary. The character that has just been removed from the matched string is then considered to be the unmatched character for the purpose of updating the dictionary and for restarting the string matching procedure.

A new string is formed in the dictionary by appending a single character to an existing string, thereby adding a new node onto a tree. The single character is the unmatched character resulting from the string matching operation. However, if it is determined that appending the single character to an existing string would exceed a predetermined maximum string length, then the new string is not added.

When all the entries in the dictionary have been filled, that is, the storage space for the dictionary has been used up, the V.42bis algorithm provides for a procedure for removing unused entries from the dictionary. The procedure accesses each entry in the dictionary to determine if a particular node is not being used. Upon identification of such an unused node, it then determines if the node is a leaf or a root node. If it is a leaf node, then the node is detached from its parent. Otherwise, the procedure continues on to the next entry.

As noted above, the size of the code word used to represent each node in the tree can be dynamically increased as necessary. As new characters are added to the dictionary, that is, new nodes are added to the tree, the size of the code word representing the node or character is compared to the current code word size. If it is determined that the size of the code word for the new character is longer then the current code word size, the current code word size is increased accordingly to allow for the representation of the new character. Consequently, one disadvantage of V.42bis algorithm is that, if a character requiring a large code word size is encountered at the beginning of the document, then the compression algorithm will be relatively inefficient.

Therefore, it is desired that a more efficient compression algorithm be developed to reduce the amount of data that need be transferred between devices connected via a communications network.

SUMMARY OF THE PRESENT INVENTION

The compression method according to the present invention assigns a code value to a word located in a document or file according to the probability of the word occurring, for example, in the English language. Each code value includes a length field and a code field. The length of the code field is variable, and its value depends upon the probability of it occurring. The higher the probability that the word would occur, the smaller the value of the code field. As a result, the number of bits required to represent the code field is less for words that occur more frequently. For the words that occur less frequently, the code field is assigned a higher value, thereby requiring a larger number of bits. Thus, the code value of the word with highest probability of occurring would be assigned the value 0b0. Conversely, the least likely word to occur would be assigned a code field having a value of 0b1111111111111 in the preferred embodiment. The value of the length field corresponds to the number of bits of the code field. A table, or dictionary, is utilized to store the words with their assigned code values. Both the transmitting and receiving devices contain an identical copy of the dictionary to allow for proper compression and decompression. Certain words can be separated into a base and an ending. For example, the word "playing" consists of a base "play" and an ending "ing," and the word "prepay" consists of a base "pre" and an ending "pay." For those words that are separable, the base and ending are preferably encoded separately. If a word is not found in the dictionary, then the word is transmitted uncompressed. The compression method according to the present invention allows for better efficiency because the length of the code values assigned to words depends upon the probability of the word occurring. Another advantage associated with the compression method according to the present invention is that the dictionary can be shared with certain word processing programs. A further advantage is that the dictionary words do not have to be transferred as uncompressed values as part of the compression method, thus further reducing the data transferred.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 2:
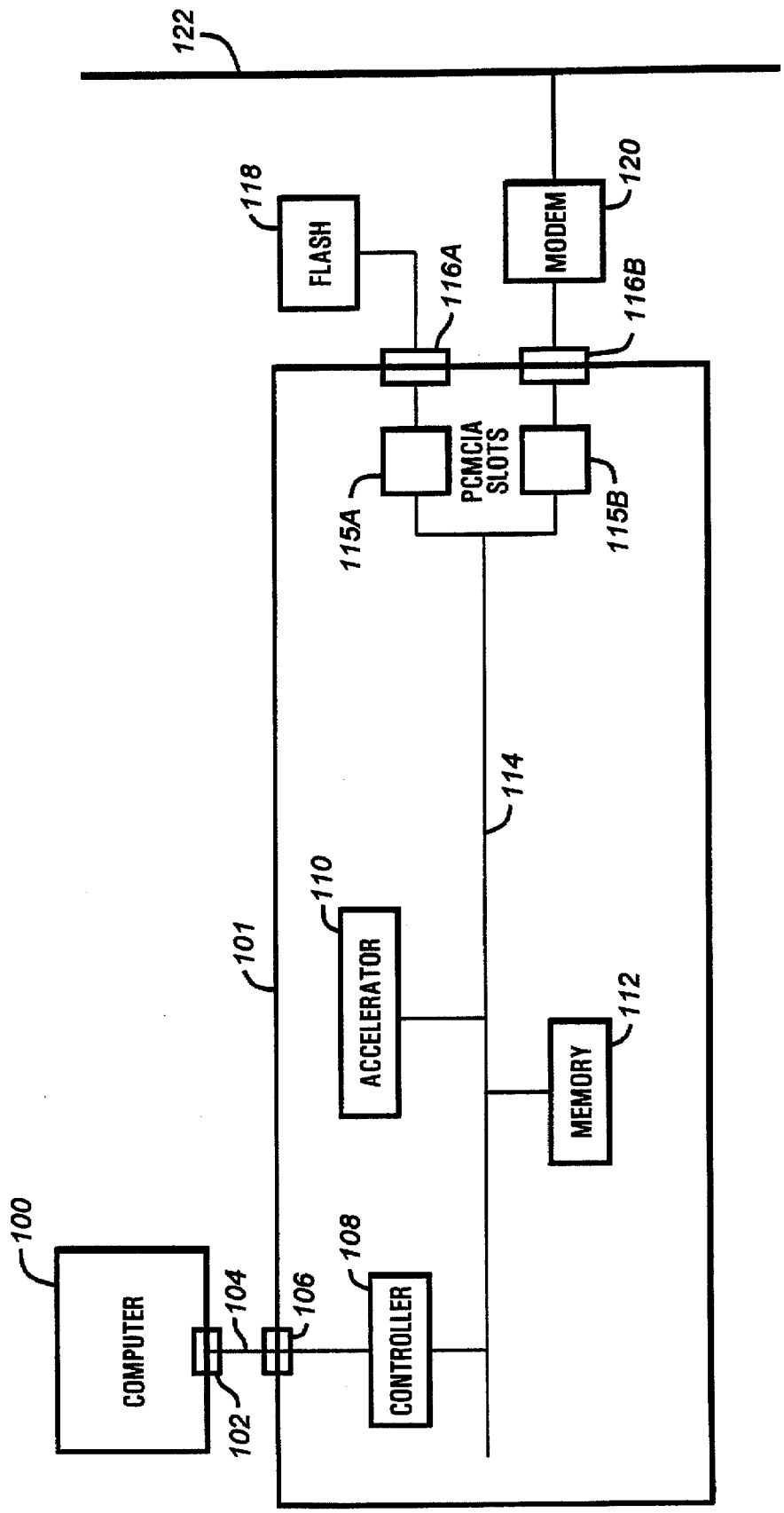
FIG. 2 is a block diagram of a device according to the present invention connected between a computer and a communications network that performs the compression and decompression of data.

Referring now to FIG. 2, a compression device 101 according to the present invention is shown connected to a computer 100. The compression device 101 is set up such that it can transmit or receive compressed data over a communications network 122. For transmission of data, the computer 100 downloads a document or file through its parallel port 102, which is connected to a connector 106 via a cable 104. Alternatively, a serial port or bus connection, such as an ISA bus connection, could be used instead of a parallel port connection. The connector 106 is connected to a controller 108 in the compression device 101. The controller 108 acts as an interface between the compression device 101 and the computer 100. In the preferred embodiment, the transfer of data through the parallel port 102 of the computer 100 to and from the compression device 101 is performed according to the protocol described in *Standard Signalling Method for a Bi-Directional Parallel Peripheral Interface for Personal Computers*, IEEE STD 1284-XXXX (Feb. 1, 1993) (hereinafter "IEEE 1284 Specification"), which is hereby incorporated by reference. The IEEE 1284 Specification defines a method for asynchronous, fully interlocked, bi-direction parallel port communications between hosts and other peripheral devices. For a description of the handshaking signals between the host computer and the peripheral device, refer to the IEEE 1284 Specification.

The controller 108 is connected to a bus 114, which connects a memory device 112 and a compression accelerator 110. The controller 108 includes a memory controller portion for controlling the memory 112, which is preferably a dynamic random access memory (DRAM). The various signals required for the control of a DRAM are well known to those skilled in the art. Upon receipt of data from the computer 100, the controller 108 writes the data into the memory device 112. Also connected to the bus 114 are two PCMCIA controllers 115A and 115B, which act as interface devices to PCMCIA slots 116A and 116B. Connected to the PCMCIA slot 116A is a flash memory card 118, which preferably stores a table of words, or dictionary, to enable the compression accelerator 110 to compress the data stored in the memory 112 according to the present invention. Communication is accomplished between the controller 108 and the accelerator 110 by the use of signals DTRDY* and COMPR. Additionally, the accelerator 110 contains various command and data registers to which the controller 108 writes to notify the accelerator 110 of certain information, including the starting address START_DATA_ADR in the memory 112 of the data to be compressed or decompressed, the starting address START_COMPR_ADR in the memory 112 where the compressed data is to be stored, the starting address START_UNCOMPR_ADR in the memory 112 where data that has been decompressed is to be stored, the ending address END_DATA_ADR of the input stream of data for compression/decompression, and the starting address START_PTR_ADR of a pointer table as will be described below. The addresses are written to the data register, while an associated command byte is written to the command register to indicate the type of data written, such as the type of memory address. The signal DTRDY* when asserted low by the controller 108 indicates to the accelerator 110 that data is available for processing in the memory 112. When the signal COMPR is asserted high, that indicates to the accelerator 110 that the available data originated from the computer 100 and is to be compressed. If the signal COMPR is deasserted low, that would indicate to the accelerator 110 that the data was received over the network 122 and is to be decompressed.

Each time the accelerator 110 retrieves a word from the memory 112 at address START_DATA_ADR plus the appropriate offset, the accelerator 110 accesses the dictionary in the flash memory card 118 to determine if a match occurs. If so, the accelerator 110 compresses the word and writes the compressed word back into the memory 112 at address START_COMPR _ADR plus the appropriate offset for subsequent transmission to a remote device connected via the communications network 122. If not, the accelerator 110 writes the word in uncompressed form to the memory 112 at the address START_COMPR_ADR plus the appropriate offset. As the accelerator 110 does not include a memory controller, it cannot access the memory 112 does act as a bus master to access the flash memory card 118. To access the memory 112, the accelerator 110 writes a command byte and a memory address to the controller 108, which responds by driving control signals to the memory 112. The command byte written by the accelerator 110 determines the type of memory operation to be performed, i.e., a write or read operation. Alternatively, the accelerator 110 could also act as a bus master on operations to the memory 112 with the controller 108 acting as a decoder and memory controller. Additionally, the accelerator 110 includes a 256-bit compression data register to store words retrieved from the dictionary. The 256-bit compression data register facilitates the processing of the retrieved word by the accelerator 110.

Alternatively, the memory 112 could be larger and receive the dictionary data from a hard disk drive or other storage device on the computer 100, with dictionary references then being to the memory 112 instead of the flash memory card 118. In either case, the starting and ending address of the dictionary is written to the accelerator 110 with the appropriate command byte. The dictionary data would be transferred when the file to be transferred was indicated. The flash memory card 118 could receive its dictionary data in a similar fashion.

As it is likely that the data file or document for compression or decompression would be too large for storage at one time in the memory device 112, multiple transfers may be required. When the controller 108 detects that the accelerator 110 has processed all the data in the memory 112, the controller 108 deasserts the signal DTRDY* and writes a new value to starting address START_DATA_ADR in conjunction with loading new data into the memory 112.

As will be described below, the dictionary assigns code values to a word according to its probability of occurring, for example, in the English language. The probability of a word occurring varies depending upon the context in which the word is used. For documents written by lawyers or scientists, for example, certain words would occur more frequently than would occur in documents written by persons from other professions. Thus, different dictionaries are created for these different applications. Text based examples are utilized in this description as they generally provide the greatest chance for compression, though the invention can be used with binary files with the use of the appropriate dictionary. The dictionaries could be tailored to the file type such as binary files developed from C++ code, from assembly code, and so forth.

Each code value includes two fields: a length field LENFD[3:0] and a code field CODEFD. For uncompressible data, a third field NBITS[10:0] is included in the code value. The length field LENFD[3:0] contains a value that indicates the number of bits which make up the code field CODEFD. The length of the code field CODEFD is variable, and is dependent upon the value assigned to it. Thus, for the words that occur more frequently, the value of the code field CODEFD is lower, thereby requiring a smaller number of bits to represent. For uncompressible data, the code field CODEFD contains the binary representation of the data. For conventional text, the binary representation is preferably ASCII. In addition to ASCII codes, the uncompressible data can also include binary fields, such as those associated with wordprocessing documents. For the uncompressible data, the additional field NBITS[10:0] is included to indicate the number of bits of uncompressed data less one. For example, if the uncompressed data contains 24 bits, the value of NBITS[10:0] is equal 23.

In the preferred embodiment, the length field LENFD [3:0] is 4 bits long and thus can be assigned values from 0b0000 to 0b1111. Preferably, the value 0b0000 is reserved to indicate that the attached field contains an uncompressed word, while the value 0b1111 is reserved to indicate that the attached field contains a pointer PTR[8:0] to a previously encoded word. This allows those words that are repeated to point back to the first occurrence of the word. The length of the pointer PTR[8:0] is 9 bits, which allows it to point to the first 512 words of the document or file. Since the length of the pointer PTR[8:0] is 9 bits, only those repeated words that require more than 9 code field bits are encoded as a pointer.

A modem 120 is connected to the PCMCIA slot 116B. The modem 120 provides the communications link between the compression device 101 and the communications network 122, though other communication link devices, such as local area network adaptors and the like could be used. As the compression algorithm is being performed, the controller 108 communicates with the modem 120 through the PCMCIA controller 115B to indicate that a communications link is desired with the remote node to which the compressed data are to be sent. The modem 120 then signals the remote device to indicate that a data transmission is about to begin. After a communications link has been established, the compressed data are transmitted from the memory 112 through the modem 120 to the remote device.

The accelerator 110 also performs decompression of compressed data received over the communications network 122. The accelerator 110 compares the encoded data with entries in the dictionary located in the flash memory device 118 to reproduce ASCII text that is provided to the computer 100. This process is described in more detail below.

The ending address END_DATA_ADR has an associated flag bit FEADR, which is set high by the controller 108 to indicate that the address END_DATA_ADR is valid. The amount of data for compression or decompression may be too large for storage in the memory device 112 at one time, which would necessitate several transfers over the communications network 122. In one embodiment, the end of the input data stream is indicated when the data flow is detected by the controller 108 to have stopped for a sufficiently long period of time, e.g., 10 seconds. When that occurs, the controller 108 knows that all the data has been transferred. It then writes the ending address of the data stream to the address END_DATA_ADR in the accelerator 110 and sets the flag bit FEADR high.

Alternatively, the ending address can be calculated by the controller 108 based on the size of the data stream stored as part of the header of the data. Certain software packages can determine the length of the file or document they are about to transmit, and include that length as part of the header information. From this information, the controller 108 can keep track of the amount of data that has been transmitted to determine what the ending address END_DATA_ADR will be.

Figure 3A:
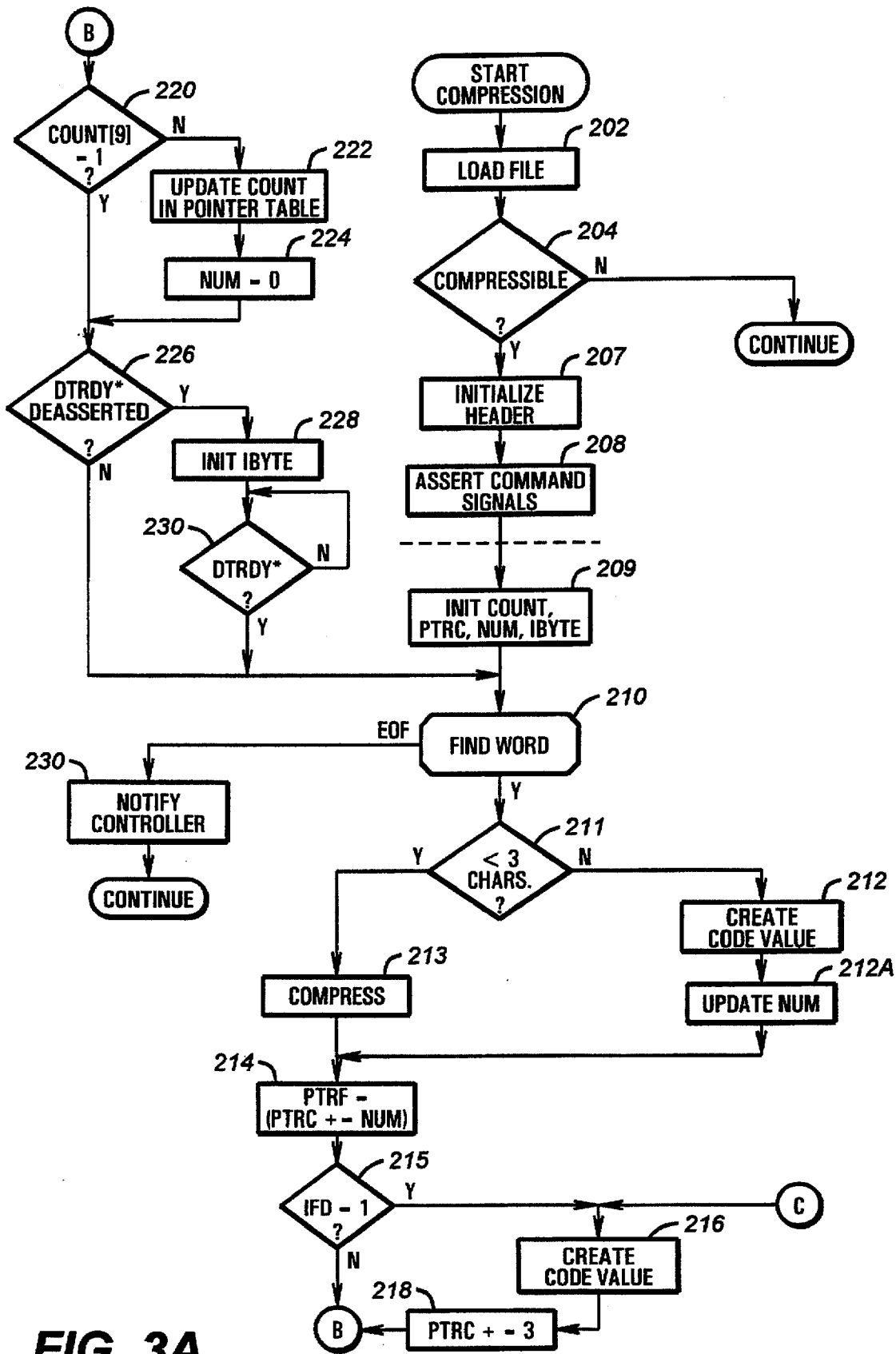
FIG. 3A is a flow diagram of the general steps of compressing data.

Referring now to FIG. 3A, a flow diagram is shown of the general steps involved in compressing a document or file. In step 202, the controller 108 loads in the document or file that is to be sent over the transmission line or communications network 122, making sure that sufficient memory capacity is reserved for storage of the compressed data. As the worst case scenario is that the entire document or file is uncompressible, the controller 108 reserves approximately half the available memory capacity for storing the "compressed" data. The available memory space is not necessarily the total storage capacity of the memory 112, as certain system information must be stored in the memory 112. In addition, a certain portion of the memory 112 is also reserved for other functions, such as to store a pointer table as will be described below.

It is contemplated that the present invention can be utilized either with files containing only ASCII text or with files created by word processing software or spreadsheet software which contain binary fields. The binary fields include information such as the font used, the size of the margins, formulas, and so forth.

Proceeding next to step 204, it is determined if the file or document is compressible. Files that have already been compressed are not compressible. A file compressed according to the present invention contains a header, whose contents will be described below. By reading the header, if there is one, it can be determined if the file or document is already compressed. Other ways to identify compressed files, such ZIP and ARC files, can also be used.

If it is determined in step 204 that the file or document is compressible, then control proceeds to step 207, where header information to be transmitted along with the compressed data file is initialized. The header information is written to the memory 112 beginning at address START_COMPR_ADR. The header information includes an ID to indicate the version of dictionary used. The receiving device compares the transmitted ID with the ID of its dictionary to determine if the dictionaries are identical. The header information also includes a flag XF to indicate whether the transmitted data is in compressed form. The flag XF is set high in step 207 to indicate that the transmitted data associated with the header information is in compressed form.

Next, control proceeds to step 208, where the controller 108 asserts a signal DTRDY* low and a signal COMPR high to indicate to the accelerator 110 that data is available for compressing. Additionally, the controller 108 also writes the starting address START_DATA_ADR of the data to be compressed, the starting address START COMPR DATA to the accelerator 110 where the compressed data is to be stored, and the starting address START PTR ADR of the pointer table, providing appropriate command bits via the command register of the accelerator 110 to indicate the type of data written.

Steps 202–208 above are performed by the controller 108. The following steps 209–230 are performed by the accelerator 110. Upon receipt of the asserted signals DTRDY* and COMPR, the accelerator 110 proceeds to step 209, where a count value COUNT[9:0] and a current byte pointer IBYTE[31:0] are initialized to the value zero. The count value COUNT[9:0] keeps track of the current word in the file or document that is being accessed, and the pointer IBYTE[31:0] denotes the current byte in the file or document from the starting address START_DATA_ADR, and is used to keep track of which bytes have already been read and processed by the accelerator 110. In addition, a pointer PTRC[31:0] is initialized, which points to the offset location in the memory 112 that contains the first byte of the assigned code value corresponding to the current word. As a result, the pointer PTRC[31:0] is initialized to a value that points past the information header.

The count values COUNT[9:0] and corresponding pointers PTRC[31:0] are stored in a separate table, hereinafter referred to as the pointer table, so that the assigned code value can be retrieved based on where a word occurred in the document. The pointer table is stored in the memory 112 starting at address START_PTR_ADR. The pointer PTRC[31:0] can refer to both compressed and uncompressed words. Thus, if a word is repeated, a search is performed to find the first occurrence of the word and to retrieve the corresponding count value COUNT[9:0] of the first word. Using the count value COUNT[9:0], the corresponding pointer PTRC[31:0] is identified from the pointer table. As noted above, since the pointer PTR[8:0] preferably contains only 9 bits, only the first 512 words in the document or file can be referred to for repeated words. However, it is contemplated that the pointer can be of any length. The bit COUNT[9] is used to indicate when the first 512 words have been exceeded. When that occurs, the updated count value COUNT[9:0] and pointer PTRC[31:0] no longer need to be written to the pointer table.

Figure 3B:
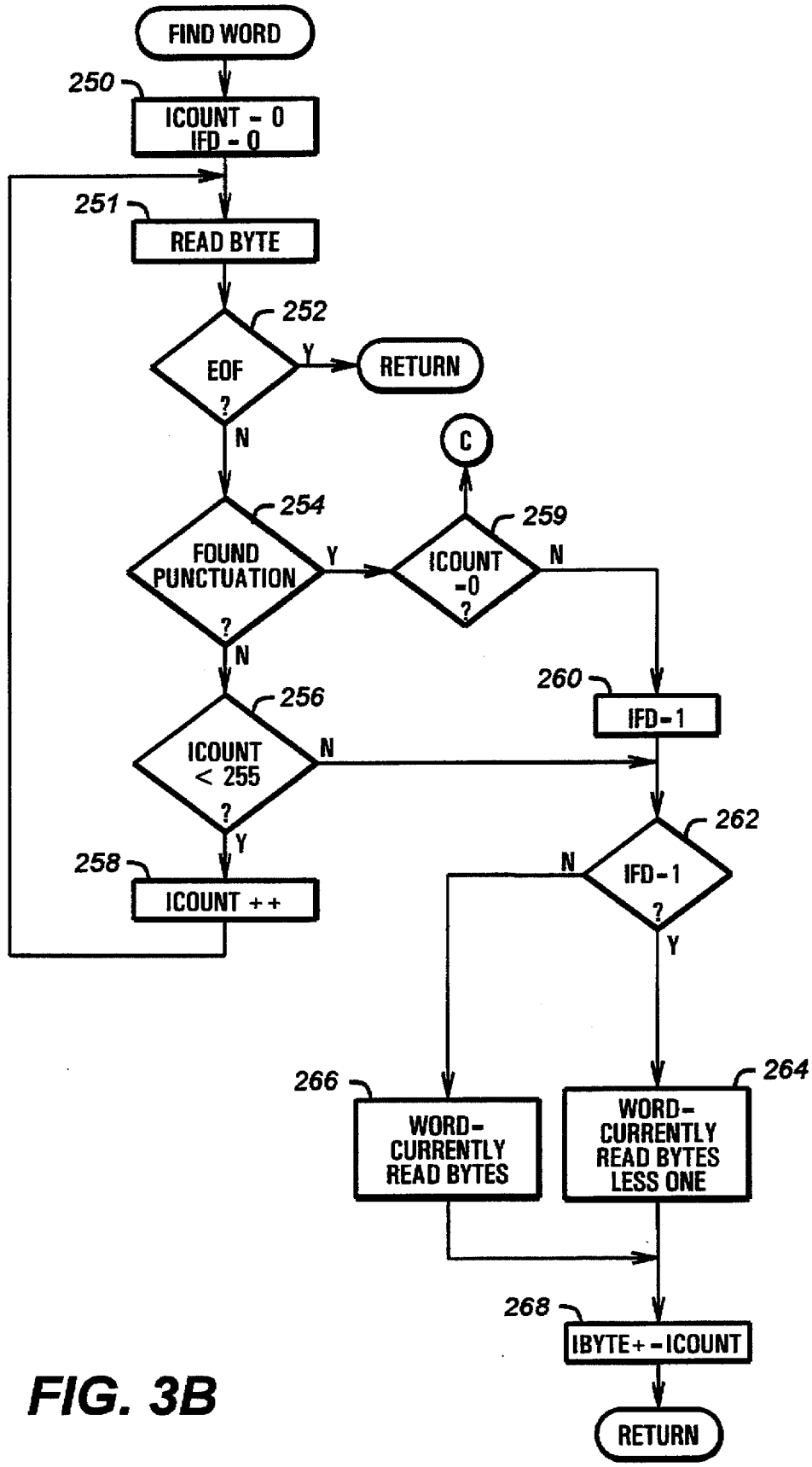
FIG. 3B is a flow diagram of a subroutine for finding a word.

Proceeding next to step 210, the accelerator 110 calls a subroutine FINDWORD to read in the next word from the memory 112, starting at address START_DATA_ADR. The flow diagram for the subroutine FINDWORD is shown in FIG. 3B, to which reference is now made. Starting in step 250, a variable ICOUNT[8:0] and a variable IFD are initialized to the value zero. The variable ICOUNT[8:0] is used to determine how many bytes from the starting location START_DATA_ADR has been searched to find a word. A word is typically surrounded by a space or other punctuation marks. Proceeding next to step 251, the byte located at offset IBYTE[31:0] (from starting address START_DATA_ADR) plus the value of ICOUNT[8:0] is read from the memory 112 to determine if it contains a value corresponding to the ASCII representation for a space; question mark "? "; comma ","; period "."; parentheses "(" or ")"; brackets "[" or "]"; or quotation marks. It is anticipated that in the long binary field at the beginning of a word processing or spreadsheet file, a particular byte may contain a value corresponding to the ASCII code of one of the above punctuation marks. In that case, the portion of the binary field is identified as a "word," although the "word" will not be found in the dictionary. As a result, the binary field "word" will be transmitted uncompressed. The retrieved byte of data as well as each subsequent byte is stored in the 256-bit compression data register until a complete word is found. A pointer is used to access the current byte of the 256-bit compression data register, the pointer being incremented with each subsequent retrieval of a byte from the memory 112. When a complete word is found, compressed, and written back to the portion of the memory 112 for storing the compressed data, the pointer to the 256-bit compression data register is reset.

Next, in step 252, the accelerator 110 determines if the end of file has been reached. This is accomplished by comparing the value of the starting address START_DATA_ADR plus the value of the current byte pointer IBYTE[31:0] with the value of END_DATA_ADR if the flag bit FEADR is set high. If a match occurs, then the end of file has been reached, in which case control returns to step 210 in FIG. 3A. Otherwise, control proceeds to step 254, where it is determined if a byte is found containing a value corresponding to the ASCII code of one of the above listed punctuation marks. If not, control proceeds to step 256, where it is determined if the value of ICOUNT[8:0] is less than 255. This check is done since the maximum number of bits of uncompressed data in the code field CODEFD is 2,048, as designated by the field NBITS[10:0]. If a search has not uncovered a punctuation mark, then the 256 bytes of data accessed thus far are sent as an uncompressed word. Thus, if in step 256, it is determined that the value of ICOUNT[8:0] is greater than or equal to 255, control proceeds to step 262. Otherwise, control proceeds to step 258, where the value of ICOUNT [8:0] is incremented by one. From step 258, control returns to step 251, where the next byte is read from the memory 112.

If in step 254, it is determined that the currently read byte contains the value corresponding to an ASCII code for one of the listed punctuation marks, control proceeds to step 259, where it is determined if the count variable ICOUNT[8:0] is equal to zero. If so, that indicates that the byte at offset IBYTE[31:0] is a punctuation mark, which by itself forms a word. Control then jumps to step 216 in FIG. 3A.

If ICOUNT[8:0] is not equal to zero, control proceeds to step 260, where the variable IFD is set high to indicate that a punctuation mark has been found. Control then proceeds to step 262, where it is determined if IFD is high. If so, control proceeds to step 264, where the currently read bytes of data at offset locations IBYTE[31:0] to {IBYTE[31:0]+ICOUNT[8:0]-1} are grouped as a sequence of characters to form a word. Thus, if the retrieved bytes in the 256-bit compression data register form a series of characters such as "star.", the grouped word would be "star" with the period "." being compressed at a later time, as will be described below. If the variable IFD is low, indicating that ICOUNT[8:0] has reached the value 255 without reaching a punctuation mark, control proceeds to step 266. In step 266, the 256 consecutive bytes of data are grouped as a "word." From both steps 264 and 266, control proceeds to step 268, where the value of ICOUNT[8:0] is added to the value of IBYTE[31:0], with the resulting sum being placed into IBYTE[31:0]. Control then returns to step 210 in FIG. 3A.

If an EOF is detected, control proceeds from step 210 to step 230, where the accelerator 110 notifies the controller 108 that an EOF has been detected. If no EOF is detected, control proceeds next to step 211, where it is determined if the length of the word identified in step 210 is less than three characters, that is, less than three bytes. This is determined from the value of ICOUNT[8:0]. If ICOUNT[8:0] is less than the value 2, then the length of the identified word is less than 3 bytes. If so, the word is left uncompressed by proceeding to step 212, where the code value for an uncompressed word is created, which contains a length field LENFD[3:0] having a value of 0b0000, the field NBITS[10:0] indicating the number of uncompressed data bits stored in CODEFD, and the code field CODEFD itself. The value of the field NBITS[10:0] is set equal to the value of {(ICOUNT[8:0]*8)+7}. In step 212, the code value for the uncompressed word is also written to the memory 112 starting at address START_COMPR_ADR plus the offset PTRC[31:0]. Next, in step 212A, a variable NUM[7:0] is set to the value (ICOUNT[7:0] +3). The value of the variable NUM[7:0] represents the number of bytes required in the memory 112 to store the code value. Eleven bits are required to store the field NBITS[10:0], four bits are required for the length field LENFD[3:0], and (ICOUNT[7:0]+1) code field CODEFD bits are required to store the uncompressed word in the memory 112. From step 212, control proceeds to step 214. If in step 211, it is determined that the length of the input word is greater than or equal to three characters, control proceeds to step 213, where the word is compressed by the accelerator 110 according to the present invention, which will be described in greater detail in FIGS. 5A and 5B.

Proceeding next to step 214, the value of the pointer PTRC[31:0] is added to the value of NUM[7:0] and placed back into PTRC[31:0]. The address {START_COMPR_ADR+PTRC[31:0]} points to the current location in the memory 112 to which the next compressed word is to be written. In addition, the sum of PTRC[31:0] and NUM[7:0] is placed into a variable PTRF[31:0]. Proceeding next to step 215, it is determined if the variable IFD is high, which indicates that the accessed word is followed by a punctuation mark as determined from the search performed in step 210. If the variable IFD is low, control proceeds to step 220. Otherwise, control proceeds to step 216, where the code value for the punctuation mark is created, comprising a length field LENFD[3:0] having the value 0b0000, the field NBITS[10:0] having the value 0b00000000111, and the 8-bit code field CODEFD containing the ASCII code for the appropriate punctuation mark. The code value for the uncompressed punctuation mark is written to the memory at address {START_COMPR_ADR+PTRC[31:0]}. Next, control proceeds to step 218, where the pointer PTRC[31:0] is incremented by the value 3 since the code value for the uncompressed punctuation mark requires 3 bytes to store.

Proceeding next to step 220, it is determined if the count bit COUNT[9] is asserted high. If so, the algorithm has passed the first 512 words of the document or file. In that case, the pointer table containing the count values COUNT[9:0] and the corresponding pointer PTRC[10:0] no longer need to be updated, as the pointer PTR[8:0] would be unable to point past the 512th word.

If the count bit COUNT[9] is high, control proceeds to step 226, where it is determined if the controller 108 has deasserted the signal DTRDY*. If not, control proceeds directly to step 210, where the next word is identified. If the count bit COUNT[9] is low, control proceeds to step 222, where the count value COUNT[9:0] is updated. The count value COUNT[7:0] is updated as follows: if the variable IFD is high, COUNT[7:0] is incremented by 2; otherwise, COUNT[7:0] is incremented by one. In the former case, COUNT[7:0] is incremented by 2 to indicate that a word plus a punctuation mark has been found. The values of COUNT[7:0] and corresponding pointer PTRF[31:0] are placed into the pointer table. Proceeding next to step 224, the value of NUM[7:0] is reset to zero. From step 224, control proceeds to step 226.

If the signal DTRDY* is detected as being deasserted, control proceeds from step 226 to step 228, where the value of IBYTE[31:0] is initialized to zero. This is the condition where the controller 108 has loaded in a new portion of data into the memory 112 and updated the address START_DATA_ADR. Next, in step 230, it is determined if the controller 108 has reasserted DTRDY*. If not, control remains in step 230. Otherwise, control proceeds to step 210 to retrieve the next word.

Transmission of the compressed words by the controller 108 to the remote node over the communications network 122 can occur while the compression algorithm is in progress or after the entire file has been compressed. The details of transmitting data with a modem over a communications network are not described, as they are well known to those skilled in the art. Once the compressed file reaches the remote device at the other end of the communications network 122, the file is decompressed by using a copy of a dictionary that is identical to the one used to compress the transmitted file. The general steps to decompress a received file is described in FIG. 4.

Figure 4:
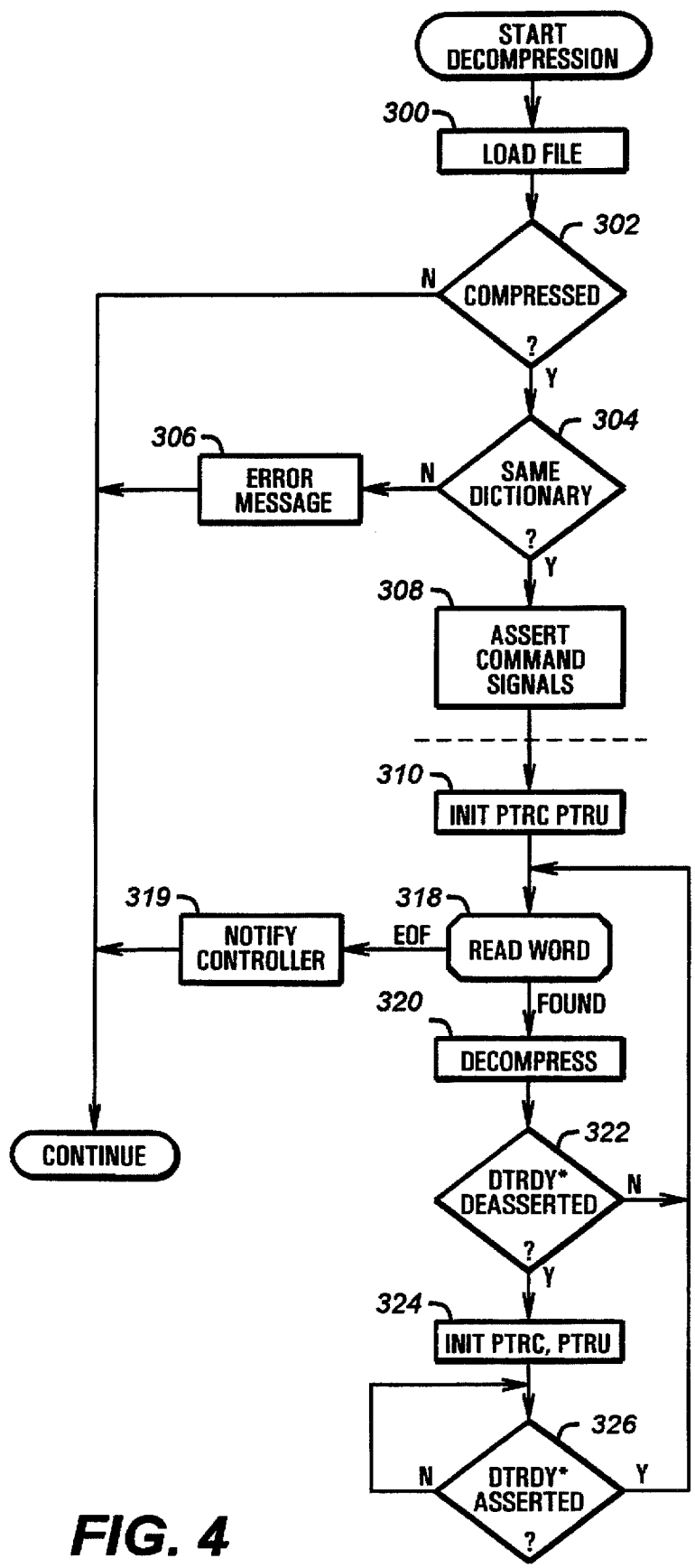
FIG. 4 is a flow diagram of the general steps of decompressing data.

Referring now to FIG. 4, a flow diagram is shown of the general steps involved in decompressing data received over the communications network 122. For the sake of brevity, it is assumed that the receiving device is configured identically to the device of FIG. 2. The receiving device can be of various different configurations as long as it contains an identical copy of the dictionary and it is able to perform the decompression algorithm according to the present invention. Starting in step 300, the received data are loaded into the memory 112 by the controller 108. Once all the data has been loaded, control proceeds to step 302, where the controller 108 determines if the input data is in compressed form by determining the state of the flag XF in the transmitted header information. If the controller 108 is unable to find the flag XF, it assumes that the received file is in uncompressed form. If not compressed, control returns to the main program, where the data is transmitted directly to the computer 100 by the controller 108. If the received data is in compressed form, control proceeds to step 304, where the controller 108 retrieves the ID in the header information to determine if the dictionary stored in the receiving device has the same ID. If not, control proceeds to step 306, where the controller 108 provides an error message to the computer 100 indicating that the received compressed data was compressed with a different dictionary. If the dictionary IDs match, then control proceeds to step 308, where the controller 108 asserts the signal DTRDY* low and deasserts the signal COMPR low to indicate to the accelerator 110 that data to be decompressed is ready. In addition, the controller 108 also writes the command and data registers of the accelerator 110 with the starting address START_DATA_ADR of the received data, the starting address START_UNCOMPR_ADR of the location in memory 112 to place the uncompressed data, and the starting and ending addresses of the dictionary. The controller 108 sets the value of the address START_DATA_ADR such that it points past the header information to the portion of the memory 112 that stores the code values.

The steps 300–308 described above are executed by the controller 108. The following steps 310–320 are performed by the accelerator 110. In response to the asserted signal DTRDY* and the deasserted signal COMPR, the accelerator 110 proceeds to step 310, where pointer values PTRC[31:0] and PTRU[31:0] are initialized to the value zero. During the decompression flow, the value of the offset PTRC[31:0] points to the current location of the received data, and the offset PTRU[31:0] points to the current location of the decompressed data in the memory 112. Proceeding next to step 318, the accelerator 110 reads in the byte of data located at address {START_DATA_ADR+PTRC[31:0]}. If an end-of-file is detected, the accelerator 110 proceeds to step 319, where it notifies the controller 108 that an EOF has been detected. The end-of-file determination is again performed by comparing the value of {START_DATA_ADR+PTRC[31:0]} with the value of END_DATA_ADR if the flag bit FEADR is set high. If the end of file is not reached, it is assumed that the first four bits of the retrieved byte is the length field LENFD[3:0] of a code value. Proceeding next to step 320, the code value is decompressed according to the present invention and written to the memory 112, which will be described in greater detail in FIG. 6. For future reference, the portion of memory 112 for storing the uncompressed data is hereinafter referred to as an array DDATA. Each entry of the array DDATA is 8 bits wide.

Control proceeds from step 320 to step 322, where it is determined if the signal DTRDY* has been deasserted. If not, control returns in step 318. If the signal DTRDY* is deasserted, indicating that the controller 108 has reloaded the memory 112 with new data and updated the address START_DATA_ADR, control proceeds to step 324. In step 324, the values of PTRC[31:0] and PTRU[31:0] are initialized to the value zero. Next, in step 326, it is determined if the signal DTRDY* has been reasserted. If so, control proceeds to step 318. Otherwise, control remains in step 326.

Once the controller 108 is notified that an end-of-file has been reached, control returns from step 319 to the main program, where the transfer of the decompressed file to the computer 100 is completed. Data can be transmitted from the memory 112 to the computer 100 as the decompression algorithm is being performed. In the alternative, if the computer 100 is busy doing other things, the decompressed document or file can be stored in the memory 112 for later transmission. After receipt of the entire document or file, the computer 100 combines the binary fields with the decompressed ASCII text if the received data form a word processor document or other file containing binary fields.

Figure 5A:
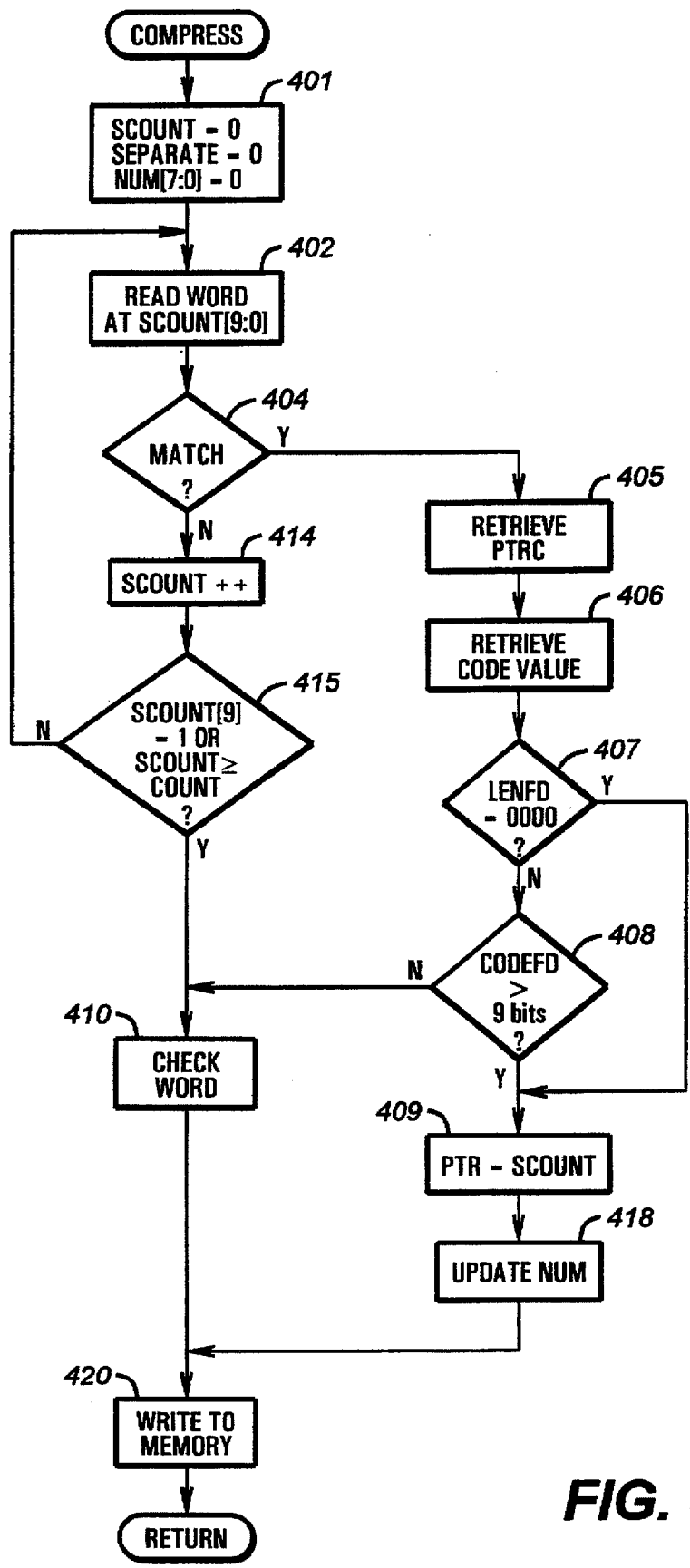
FIG. 5A is a flow diagram of the steps of compressing a word.

Referring now to FIG. 5A, a flow diagram is shown of the compression algorithm according to the present invention invoked in step 213 of FIG. 3A. Beginning in step 401, a count value SCOUNT[9:0] is initialized to the value zero, a flag SEPARATE is initialized low, and the variable NUM [7:0] is initialized to the value zero. Next, control proceeds to step 402, where a search is performed of the first 512 words of the document or file starting at address START_DATA_ADR to determine if the word has occurred before. The search is performed in a sequential manner starting from the first word, that is, the count value SCOUNT[9:0] equal to zero. Proceeding to step 404, it is determined if a match occurs. If not, control proceeds to step 414, where the value of SCOUNT[9:0] is incremented by one. From step 414, control proceeds to step 415, where it is determined if the count bit SCOUNT[9] is high, or the value of SCOUNT[9:0] is greater than or equal to the value of COUNT[9:0]. The former case indicates that 512 words have already been searched. The latter case indicates that the searched word is at or is past the currently read word indicating that the end of the stored values has been reached, there being less than 512 stored values in this case. If either of the conditions is true, control proceeds to step 410. If neither is true, control returns to step 402 to search the word at the incremented value of SCOUNT[9:0].

When a match is determined in step 404, control proceeds to step 405, where the pointer PTRC[10:0] corresponding to the count value SCOUNT[9:0] is retrieved from the pointer table. The pointer PTRC[10:0] points to the code value corresponding to the first occurrence of the currently read word. Next, in step 406, the code value accessed by the address {START_COMPR_ADR+PTRC[10:0]} is retrieved from the memory 112. The retrieved code value can either consist of a length field LENFD[3:0] having a value of 0b0000 followed by the field NBITS[10:0] indicating the number of uncompressed data bits that follow, or of a length field LENFD[3:0] having a value between 0b0001 and 0b1110 followed by a variable length code field CODEFD. Control proceeds next to step 407, where it is determined if the value of the length field is equal to 0b0000. If so, control proceeds to step 409, where the pointer PTR[8:0] is assigned to the value SCOUNT[9:0], which corresponds to the offset of the first occurrence of the word. If the value of LENFD[3:0] is not 0b0000, control proceeds to step 408, where it is determined if the retrieved code field CODEFD is longer than 9 bits. If not, control proceeds to step 410. If the length of the code field CODEFD is greater than 9 bits, then control proceeds to step 409, where the pointer PTR[8:0] is assigned to the count value SCOUNT [9:0]. Thus, the code value created for the currently read word includes a length field LENFD[3:0] having a value 0b1111 followed by the pointer PTR[8:0]. Next, in step 418, the value of NUM[7:0] is set to the value 2 to indicate that two bytes are required to store the pointer PTR[8:0] and its associated length field LENFD[3:0].

Figure 5B:
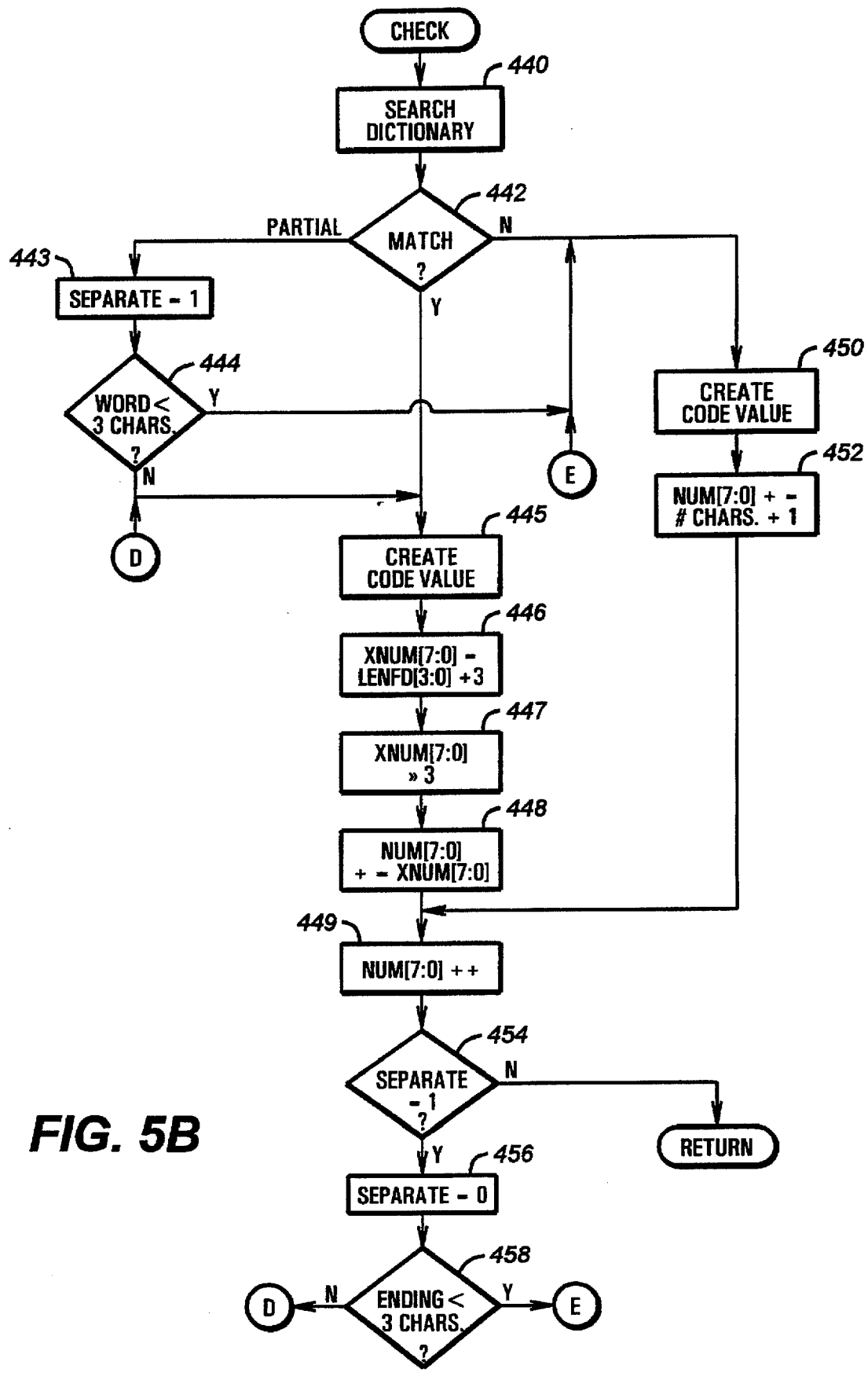
FIG. 5B is a flow diagram of the steps of creating the code value of a word.

If no match is found in steps 402, 404, 414 and 415, control proceeds to step 410, where a subroutine CHECK is invoked, which is shown in FIG. 5B. The subroutine CHECK determines if the retrieved word is located in the dictionary and assigns a code value accordingly. From step 418 or 410, control proceeds to step 420, where the code value is written to the memory 112 at a location starting at offset PTRC[31:0].

Referring now to FIG. 5B, in step 440, the accelerator 110 accesses the flash memory card 118 (through the controller 108) to search for the retrieved word in the dictionary. The search for the word in the dictionary is preferably performed according to the Quicksort algorithm, which is well known to those skilled in the art. The Quicksort algorithm is described in Doug Cooper & Michael Clancy, Oh! Pascal! , pp. 530–534 (2d ed. 1985), which is hereby incorporated by reference. The Quicksort algorithm is a modification of the binary search, or divide and conquer, algorithm. In the binary search algorithm, the stored values are repeatedly divided into an upper half and a lower half until the solution space has become small enough such that finding the matching string becomes trivial. In the Quicksort algorithm, a random string is picked. Any string having a value greater than the random string is considered to be in the upper half and any string having a value less than the random string is considered to be in the lower half. The process is continued until the matching string is found.

In the alternative, a hashing function and hash table, such as those described for the Lempel-Ziv algorithm discussed above, can also be used to perform the search. Other sorting or searching functions as known to those skilled in the art could also be utilized.

Proceeding next to step 442, it is determined if a match occurs. If the word is not in the dictionary, control proceeds to step 450, where the length field LENFD[3:0] is assigned a value 0b0000. The field NBITS[10:0], which is assigned to the value {ICOUNT[8:0]*8+7}, along with the number of uncompressed data bits designated by {NBITS[10:0]+1} are appended to the length field LENFD[3:0] to form the code value for the uncompressed word. Next, in step 452, the value of the variable NUM[7:0] is incremented by the number of characters or bytes that are in the uncompressible word plus one. The value of NUM[7:0] represents the number of bytes required to store the encoded word. For an uncompressed word, each character requires one byte of storage space and the length field LENFD[3:0] and field NBITS[10:0] require two additional bytes. Thus, from step 452, control proceeds to step 449, where the value of NUM[7:0] is incremented by one.

If it is determined in step 442 that a match of the entire word occurs, then control proceeds to step 445, where the code value including a length field LENFD[3:0] and a code field CODEFD corresponding to the matched word is retrieved from the dictionary. If the entire word is matched into an entry in the dictionary, then that indicates the word is not separable into a base and an ending. The length field LENFD[3:0] contains a value equal to the length of the code field CODEFD, and the code field CODEFD is assigned a value in the dictionary which is dependent upon the probability of the word occurring. Proceeding next to step 446, a temporary variable XNUM[7:0] is set equal to the value of the length field LENFD[3:0] plus the value 3. This represents the total number of bits required to represent the length field LENFD[3:0] and the code field CODEFD less one. Next, in step 447, a 3-bit binary shift right operation is performed on XNUM[7:0]. This effectively divides the value of XNUM[7:0] by 8, leaving the remainder in XNUM [7:0]. The remainder indicates the number of bytes required to store the length field LENFD[3:0] and the code field CODEFD less one. Proceeding next to step 448, the value of NUM[7:0] is added to the value of XNUM[7:0] and placed into NUM[7:0]. From step 448, control proceeds to step 449, where the value of NUM[7:0] is incremented by one.

Thus, in addition to generating the code value for the current word, the CHECK subroutine also returns the value of NUM[7:0] to indicate the number of bytes required to store the code value.

If it is determined in step 442 that only a first portion of the word matches an entry in the dictionary, then control proceeds to step 443, where the flag SEPARATE is asserted high to indicate that the word is separable into a base and an ending. In this case, the matched first portion is the base. From step 443, control proceeds to step 444 where it is determined if the length of the base is less than 3 characters or bytes. If so, control proceeds to step 450, where the code value for an uncompressed word is created that includes a length field LENFD[3:0] equal 0b0000, the field NBITS [10:0] equal to the number of characters multiplied by eight less one, and the code field consisting of the uncompressed data bits. However, if the base is longer than three characters or bytes, then control proceeds to step 445, where the code value corresponding to the base is retrieved from the dictionary. Next, in steps 446–449, the value of NUM[7:0] is updated.

From step 449, control proceeds to step 454, where it is determined if the flag SEPARATE is set high. If not, control returns to step 410 in FIG. 5A. If the word is separable, then control proceeds to step 456, where the flag SEPARATE is set low. Next, in step 458, it is determined if the ending contains less than 3 characters. If so, control proceeds to step 450, where the code value for an uncompressed word is created. If the number of characters in the ending is greater than or equal to 3, then control proceeds to step 445, where the code value for the ending is retrieved from the dictionary. Next, in steps 446–449, the variable NUM[7:0] is updated to reflect the additional number of bytes required to store the code value for the ending. From step 449, control again proceeds to step 454, where it is determined that the flag SEPARATE is low this time. From step 454, control returns to step 410 in FIG. 5A.

Figure 6:
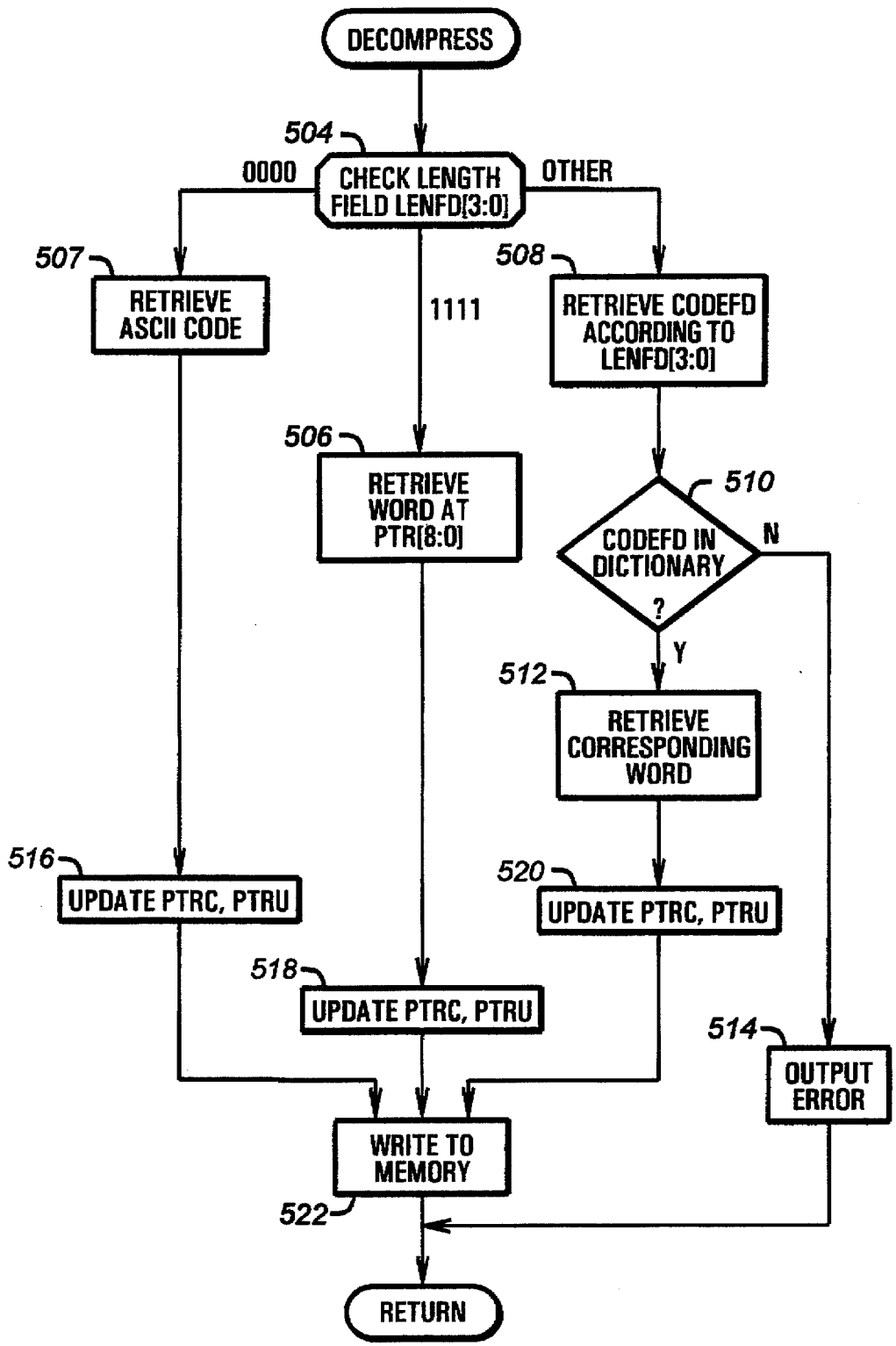
FIG. 6 is a flow diagram of the steps of decompressing a word.

Referring now to FIG. 6, a flow diagram is shown of the decompression algorithm according to the present invention. Beginning in step 504, the value of the length field LENFD [3:0] of the code value read in step 318 of FIG. 4 is checked. If the value of the length field LENFD[3:0] is equal to 0b0000, then control proceeds to step 507, where the value of NBITS[10:0] is determined. The number of uncompressed data bits denoted by NBITS[10:0] are retrieved as an uncompressed word. Next, control proceeds to step 516, where the value of PTRC[31:0] is incremented by the value of (NBITS[10:0]+1)/8 plus 2, and the value of PTRU[31:0] is incremented by the value of (NBITS[10:0]+1)/8. Control proceeds next to step 522, where the uncompressed word is written to the array DDATA at offset PTRU[31:0].

If the value of the length field LENFD[3:0] is equal to 0b1111, then the 9-bit pointer PTR[8:0] is retrieved. The word at DDATA(PTR[8:0]) is retrieved, which corresponds to the first occurrence of the current word. The retrieved word is either delimited by a punctuation mark or has a maximum width of 256 bits.

Proceeding next to step 518, the values of the pointers PTRC[31:0] and PTRU[310] are updated. The value of PTRC[31:0] is incremented by the value 2, while the value of PTRU[31:0] is incremented by the number of characters making up the retrieved word at DDATA(PTR[8:0]). Next, in step 522, the retrieved data is written to the array DDATA in the memory 112 at offset PTRU[31:0].

If the length field LENFD[3:0] is any value other 0b0000 or 0b1111, control proceeds to step 508, where the next number of bits specified by the length field LENFD[3:0] are retrieved. Those bits correspond to the code field CODEFD of a compressed word. Proceeding next to step 510, it is determined if the code field CODEFD is located in the dictionary located in the flash memory card 118. If not, control proceeds to step 514, where an error message is output. If the code field CODEFD is found in the dictionary, then the corresponding word is retrieved in step 512. Again, the search algorithm to find a matching code value can be the Quicksort algorithm, a hash function and hash table or other techniques. Proceeding to step 520, the value of PTRC[31:0] is incremented by the value calculated according to the method outlined in steps 446–449 given the value of LENFD[3:0]. The value of PTRU[31:0] is incremented by the number of characters contained in the word retrieved from the dictionary. Next, in step 522, the retrieved word is written to the array DDATA in the memory 112 at offset PTRU[31:0]. From step 522, control returns to step 320 in FIG. 4.

Figures 1, 7:
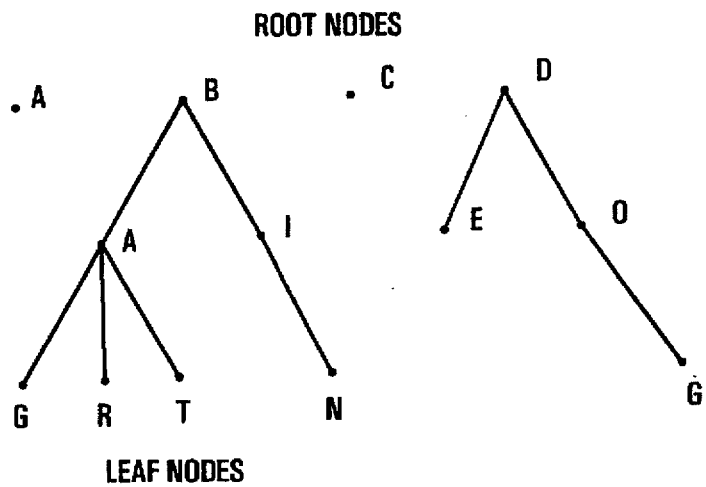
FIG. 1 shows a set of trees representing certain strings according to the V.42bis algorithm.
FIG. 7 shows portions of an exemplary dictionary used with the compression or decompression method according to the present invention.

An example of a dictionary used with the preferred embodiment of the present invention is shown in FIG. 7. In the dictionary, each word is assigned a value according to the probability of its occurrence in the English language. Thus, for example, the three-character word "the" would be assigned the code value {0001 0}, that is, the length field LENFD[3:0] is equal to 0b0001 and code field CODEFD is equal to 0b0, as it would have the highest probability of occurring in the English language for words longer than two characters. Next, for example, the word "and" is assigned the code value {0001 1}. The words "ing", "for", "this," "that," and "but" are assigned the code values {0010 00} {0010 01}, {0010 10}, {0010 11}, and {0011 000}, respectively. Occurring with less frequency is the word "father," which is assigned the code value {0101 10111}. A rare word such as the word "xylophone" would be assigned the code value {1110 1111111111111}. It is contemplated that the probability of a word occurring in the English language would vary depending upon what context it is used in. Consequently, the partial list provided in FIG. 7 is merely an example of how code values can be assigned.

Thus, it can be seen that according to the preferred embodiment of the present invention, the length of the code value for a particular word depends upon the probability of its occurring in the English language. The higher the probability of the word occurring, the shorter the length of the code word. This allows for greater compression efficiency than is available from prior art compression algorithms.

Examples of dictionaries other than the English language dictionary that can be used with this algorithm are a dictionary for engineering applications, a dictionary for lawyers, a dictionary for bioscientists, a Spanish dictionary, a German dictionary and a French dictionary. In addition, dictionaries could also be developed for non-text applications such as binary files and other formats.

The dictionary stored in the flash memory card 118 can be shared with spell checkers used with certain word processors, such as Word from Microsoft Corporation. The dictionary would thus be divided into two tables. The first table, which is shared with the spell checker, contains the list of words. The second table contains the code values corresponding to the list of words in the first table.

The foregoing has described a data compression algorithm in which a word is assigned a code value according to the probability of the word occurring, for example, in the English language. The code value contains a length field and a code field. The number of bits used to represent the length field is fixed, whereas the length of the code field is variable. The code field can be assigned values between 0b0 and 0b111111111111111. The value 0b0 is assigned for the word having the greatest probability of occurring and the value 0b111111111111111 is assigned for the word having the least probability of occurring. The value of the length field is equal to the number of bits contained in the code field. The code values are stored in a dictionary with their corresponding words. If it is determined that an input word does not exist in the dictionary, then the length field is assigned the value 0b0000 and the word is represented in its ASCII code.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. A data compression method compressing an input stream of data having a beginning and an end for transmission over a communications network from a first device to a second device, both the first and second devices being connected to the communications network, the first device including a buffer memory having a plurality of entries, wherein the first device and second device each includes a memory device for storing a table containing a list of words and a list of corresponding code values, each code value being represented as a first number of bits, said the first number of bits being variable and dependent upon the probability of the word occurring, the first number of bits being less for higher probability words, the method comprising the steps of:

(a) reading a next word from the input stream of data;
(b) determining if said read word contains more than a predetermined number of characters;
(c) performing steps (d)–(f) only if said read word contains more than said predetermined number of characters;
(d) accessing the memory device to search the table to determine if said read word matches one of the words in the table;
(e) representing said read word as the code value corresponding to the matched word in the table if a match occurs;
(f) storing the code value in the next entry of the buffer memory for transmission over the communications network to the second device if a match occurs;
(g) determining if the end of the input stream of data has been reached; and
(h) repeating steps (a)–(h) if the end of the input stream of data has not been reached.

2. A data compression method compressing an input stream of data having a beginning and an end for transmission over a communications network from first device to a second device, both the first and second devices being connected to the communications network, the first device including a buffer memory having a plurality of entries, wherein the first device and second device each includes a memory device for storing a table containing a list of words and a list of corresponding code values, each code value being represented as a first number of bits, said the first number of bits being variable and dependent upon the probability of the word occurring, the first number of bits being less for higher probability words, the method comprising the steps of:

(a) reading a next word from the input stream of data;
(b) searching previously read words in the input stream of data to determine if said read word of step (a) matches one of said previously read words;
(c) if a match occurs in step (b), representing said read word of step (a) as a code value including a pointer containing an address pointing to said matching previously read word;
(d) if a match occurs in step (b), storing said code value of step (c) in the next entry in the buffer memory for transmission over the communications network to the second device;
(e) if no match occurs in step (b), accessing the memory device to search the table to determine if said read word matches one of the words in the table;
(f) if no match occurs in step (b), representing said read word as the code value corresponding to the matched word in the table if a match occurs in step (e);
(g) if no match occurs in step (b), storing the code value in the next entry of the buffer memory for transmission over the communications network to the second device if a match occurs in step (e);
(h) determining if the end of the input stream of data has been reached; and
(i) repeating steps (a)–(i) if the end of the input stream of data has not been reached.

3. The method of claim 2, wherein said code value of step (c) further includes a length field, said length field containing a predetermined value to indicate said code value includes said pointer.

4. A method of compressing an input stream of data having a beginning and an end for transmission over a communications network from a first device to a second device, both the first and second devices being connected to the communications network, the first device including a buffer memory having a plurality of entries, wherein the first device and second device each includes a memory device for storing a table containing a list of words and a list of corresponding first code values, each of the first code values being represented as a first number of bits, the first number of bits being variable and dependent upon the probability of the word occurring, the first number of bits being less for higher probability words, the method comprising the steps of:

(a) reading a next word from the input stream of data;
(b) searching previously read words in the input stream of data to determine if said read word of step (a) matches one of said previously read words;
(c) representing said read word of step (a) as a second code value including a pointer containing an address pointing to said matching previously read word if a match occurs in step; and
(d) storing said second code value in the next entry of the buffer memory for transmission over the communications network to the second device if a match occurs in step (b);
(e) accessing the memory device to search the table to determine if said read word matches one of the words in the table if a match does not occur in step [(14)](b);
(f) representing said read word as a third code value including a binary representation of said read word in uncompressed form if a match does not occur in step [1 4](e); and (g) storing said third code value in the next entry of the buffer memory for transmission over the communications network to the second device if a match does not occur in step (e);

(h) representing said read word as the first code value corresponding to the matched word in the table if a match occurs in step (e); and (i) storing the first code value in the next entry of the buffer memory for transmission over the communications network to the second device if a match occurs in step (e);

(j) determining if the end of the input stream of data has been reached; and (k) repeating steps (a)–(k) if the end of the input stream of data has not been reached.

5. The method of claim 4, wherein each of the first code values includes a first length field and a first code field, said first code value being represented by a second number of bits, wherein said second number of bits is variable and dependent upon the probability of the corresponding word occurring, and wherein said first length field has a value indicating said second number of bits, wherein each of said second code values further includes a second length field having a first predetermined value indicating said second code value includes said pointer, and wherein each of said third code values further includes a third length field having a second predetermined value indicating said third code value includes said uncompressed word.

6. The method of claim 5, wherein each of said first length fields, said second length fields, and said third length fields is represented by a third number of bits, said third number of bits being fixed.

7. The method of claim 5, wherein said uncompressed word is represented by a number of data bits, and wherein said third code value further includes a field indicating said number of uncompressed data bits.

8. A decompression method decompressing an input stream of data having a beginning and an end being transmitted over a communications network from a first device to a second device, the data including code values, the first and second devices being connected to the communications network, the second device including a buffer memory having a plurality of entries, wherein the first device and second device each includes a memory device for storing a table containing a list of words and a list of corresponding code values, each code value being represented as a first number of bits, the first number of bits being variable and dependent upon the probability of the word occurring the first number of bits being less for higher probability words, the method comprising the steps of:

(a) reading a next code value from the input stream of data, wherein said read code value includes a length field, wherein said length field contains a predetermined value if said read code value represents an uncompressed word, wherein said read code value for said uncompressed word further includes a binary representation of said uncompressed word;

(b) determining if said length field contains said predetermined value;

(c) retrieving said binary representation of said uncompressed word if said length field contains said predetermined value;

(d) storing said retrieved binary representation of said uncompressed word in the next entry of the buffer memory if said length field contains said predetermined value instead of performing steps (e)–(g);

(e) accessing the memory device to search the table to determine if said read code value matches one of the code values in the table;

(f) retrieving the word corresponding to said read code value from the table if a match occurs;

(g) storing the retrieved word in the next entry of the buffer memory if a match occurs;

(h) determining if the end of the input stream of data has been reached; and (i) repeating steps (a)–(i) if the end of the input stream of data has not been reached.

9. A decompression method decompressing an input stream of data having a beginning and an end being transmitted over a communications network from a first device to a second device, the data including code values, the first and second devices being connected to the communications network, the second device including a buffer memory having a plurality of entries, wherein the first device and second device each includes a memory device for storing a table containing a list of words and a list of corresponding code values, each code value being represented as a first number of bits, the first number of bits being variable and dependent upon the probability of the word occurring the first number of bits being less for higher probability words, the method comprising the steps of:

(a) reading a next code value from the input stream of data, wherein said read code value includes a length field, wherein said length field contains a predetermined value if said read code value includes a pointer containing an address pointing to an entry in the buffer memory containing a word previously decompressed from the input stream of data;

(b) determining if said length field contains said predetermined value;

(c) retrieving said word from the buffer memory if said length field contains said predetermined value wherein the step of retrieving said word from the buffer memory further comprises the steps of:
 (1) retrieving said pointer from said read code value;
 (2) accessing said entry in the buffer memory pointed to by said address contained in said pointer;
 (3) retrieving said word in said entry; and
 (4) storing said word in the next entry of the buffer memory;

(d) retrieving said word from table if said length field does not contain said predetermined value, and wherein the step of retrieving said word from table further comprises the steps of;
 (1) accessing the memory device to search the table to determine if said read code value matches one of the code values in the table;
 (2) retrieving the word corresponding to said read code value from the table if a match occurs; and
 (3) storing the retrieved word in the next entry of the buffer memory if a match occurs;

(e) determining if the end of the input stream of data has been reached; and (f) repeating steps (a)–(f) if the end of the input stream of data has not been reached.

10. A data compression unit, comprising:

a controller;

a compression processor;

a buffer memory having a plurality of entries for storing output code values for read words, wherein each code value includes a length field and a code field;

a memory device for storing a table containing a list of words and a list of corresponding code values coupled to said processor;

code for execution by said compression processor, said code when executed performing the steps of:

(a) reading a next word from an input stream of data having a beginning and an end;

(b) accessing the buffer memory to determine if said read word matches one of the previously read words;

(c) if a match occurs in step (b), storing said read word in the buffer memory as a previously read word, comprising the steps of:
  (1) representing said read word of step (a) as a code value including a pointer containing an address pointing to said matching previously read word; and
  (2) storing said code value of step (c)(1) in the next entry in the buffer memory as compressed data for transmission over the communications network;

(d) if a match did not occur in step (b), accessing the memory device to search the table to determine if said read word matches one of the words in the table;

(e) if a match occurs in step (d), storing said read word in the buffer memory, comprising the steps of:
  (1) representing said read word as the code value corresponding to the matched word in the table; and
  (2) storing the code value of step (e)(1) in the next entry of the buffer memory as compressed data for transmission over the communications network;

(f) if a match did not occur in step (b), and a match did not occur in step (d), storing said read word as an unknown word in the buffer memory, comprising the steps of:
  (1) representing said read word as a code value including a binary representation of said read word in uncompressed form; and
  (2) storing said code value of step (f)(1) in the next entry in the buffer memory as compressed data for transmission over the communications network;

(g) determining if the end of the input stream of data has been reached; and (h) repeating steps (a)–(h) if the end of the input stream of data has not been reached, wherein said processor is coupled to said controller and said memory device for providing compressed data from said executed code, wherein said buffer memory is coupled to said processor for storing compressed data from said executed code; and an input/output port for connecting said data compression unit to a second computer or a communications network, wherein said input/output port is coupled to said controller and said buffer memory for transmittal of said compressed data stored in said buffer memory.

11. The system of claim 10, wherein said processor is on an accelerator card.

12. A system, comprising:

a first computer containing computer data and an input/output port;

a data compression unit coupled to said first computer for compressing said computer data wherein said data compression unit comprises:

an input/output port for coupling said data compression unit to input/output port of said first computer;

a controller;

a compression processor;

a buffer memory having a plurality of entries for storing output code values for read words, wherein each code value includes a length field and a code field;

a memory device for storing a table containing a list of words and a list of corresponding code values coupled to said processor;

code for execution by said compression processor, said code when executed performing the steps of:

(a) reading a next word from an input stream of data having a beginning and an end;

(b) accessing the buffer memory to determine if said read word matches one of the previously read words;

(c) if a match occurs in step (b), storing said read word in the buffer memory as a previously read word, comprising the steps of:
  (1) representing said read word of step (a) as a code value including a pointer containing an address pointing to said matching previously read word; and
  (2) storing said code value of step (c)(1) in the next entry in the buffer memory as compressed data for transmission over the communications network;

(d) if a match did not occur in step (b), accessing the memory device to search the table to determine if said read word matches one of the words in the table;

(e) if a match occurs in step (d), storing said read word in the buffer memory, comprising the steps of:
  (1) representing said read word as the code value corresponding to the matched word in the table; and
  (2) storing the code value of step (e)(1) in the next entry of the buffer memory as compressed data for transmission over the communications network;

(f) if a match did not occur in step (b), and a match did not occur in step (d), storing said read word as an unknown word in the buffer memory, comprising the steps of:
  (1) representing said read word as a code value including a binary representation of said read word in uncompressed form; and
  (2) storing said code value of step (f)(1) in the next entry in the buffer memory as compressed data for transmission over the communications network;

(g) determining if the end of the input stream of data has been reached; and (h) repeating steps (a)–(h) if the end of the input stream of data has not been reached, wherein said processor is coupled to said controller and said memory device for providing compressed data from said executed code, wherein said buffer memory is coupled to said processor for storing compressed data from said executed code; and a second input/output port for connecting said data compression unit to a second computer or a communications network, wherein said second input/output port is coupled to said controller and said buffer memory for transmittal of said compressed data stored in said buffer memory; and a modem coupled to said second input/output port of said data compression unit for transmission of compressed data over a communications network.

13. The system of claim 12, further comprising:

a second computer;

a second modem coupled to said communications network;

a second data compression unit coupled to said modem and said second computer wherein said second modem and said second data compression unit are adapted to communicate over said communications network to said first mode.

* * * * *

UNITED STATES PATENT AND TRADEMARK OFFICE
CERTIFICATE OF CORRECTION

| | |
|---|---|
| PATENT NO. | : 5,663,721 |
| DATED | : September 2, 1997 |
| INVENTOR(S) | : Markku J. Rossi |

It is certified that error appears in the above-identified patent and that said Letters Patent is hereby corrected as shown below:

Column 18,
Lines 63 and 66-67, after "step" delete "[(14)]".

Signed and Sealed this

Twenty-fourth Day of January, 2006

JON W. DUDAS
*Director of the United States Patent and Trademark Office*